United States Patent [19]

Skipper et al.

[11] Patent Number: 4,628,275
[45] Date of Patent: Dec. 9, 1986

[54] EFFICIENT POWER AMPLIFIER FOR HIGH CAPACITIVE DEVICES

[75] Inventors: John D. Skipper; Steven M. Long, both of Albuquerque, N. Mex.

[73] Assignee: Rockwell International Corporation, El Segundo, Calif.

[21] Appl. No.: 759,717

[22] Filed: Jul. 29, 1985

[51] Int. Cl.⁴ .............................................. H03F 3/38
[52] U.S. Cl. ..................................... 330/10; 330/102; 330/105; 330/207 A; 330/251
[58] Field of Search ............. 330/10, 102, 105, 207 A, 330/251

[56] References Cited

U.S. PATENT DOCUMENTS

| 4,092,610 | 5/1978 | White et al. | 330/207 A |
| 4,404,526 | 9/1983 | Kirn | 330/10 |
| 4,531,096 | 7/1985 | Yokoyama | 330/251 X |

OTHER PUBLICATIONS

Smart, "A Switching Amplifier for Capacitive Loads Using Incremental Resonant Charging," IEEE Power Electronics Specialists Conference San Diego, CA, 18-22 Jun. 1979, pp. 98-108.

Primary Examiner—James B. Mullins
Attorney, Agent, or Firm—H. Fredrick Hamann; Harry B. Field; Lawrence N. Ginsberg

[57] ABSTRACT

An efficient power amplifier for high-capacitive device C2 in load string 10. The load string 10 includes a reference capacitor C3, a resistor R1, and an inductor L1. A large capacitor C1 is connected to load string 10 through high voltage power bridge 28. A current sensing feedback 30 is utilized to produce a triangular waveform of current in load string 10 for causing charge to be alternatively removed from capacitor C1 and delivered to device C2 through inductor L1 and then returned to capacitor C1 with any losses replenished by the dc power source. A voltage sensing feedback 14 is used to modulate the triangular current waveform. The power amplifier behaves as a stable linear dc coupled operational amplifier delivering a large reactive current with only slight losses.

14 Claims, 5 Drawing Figures

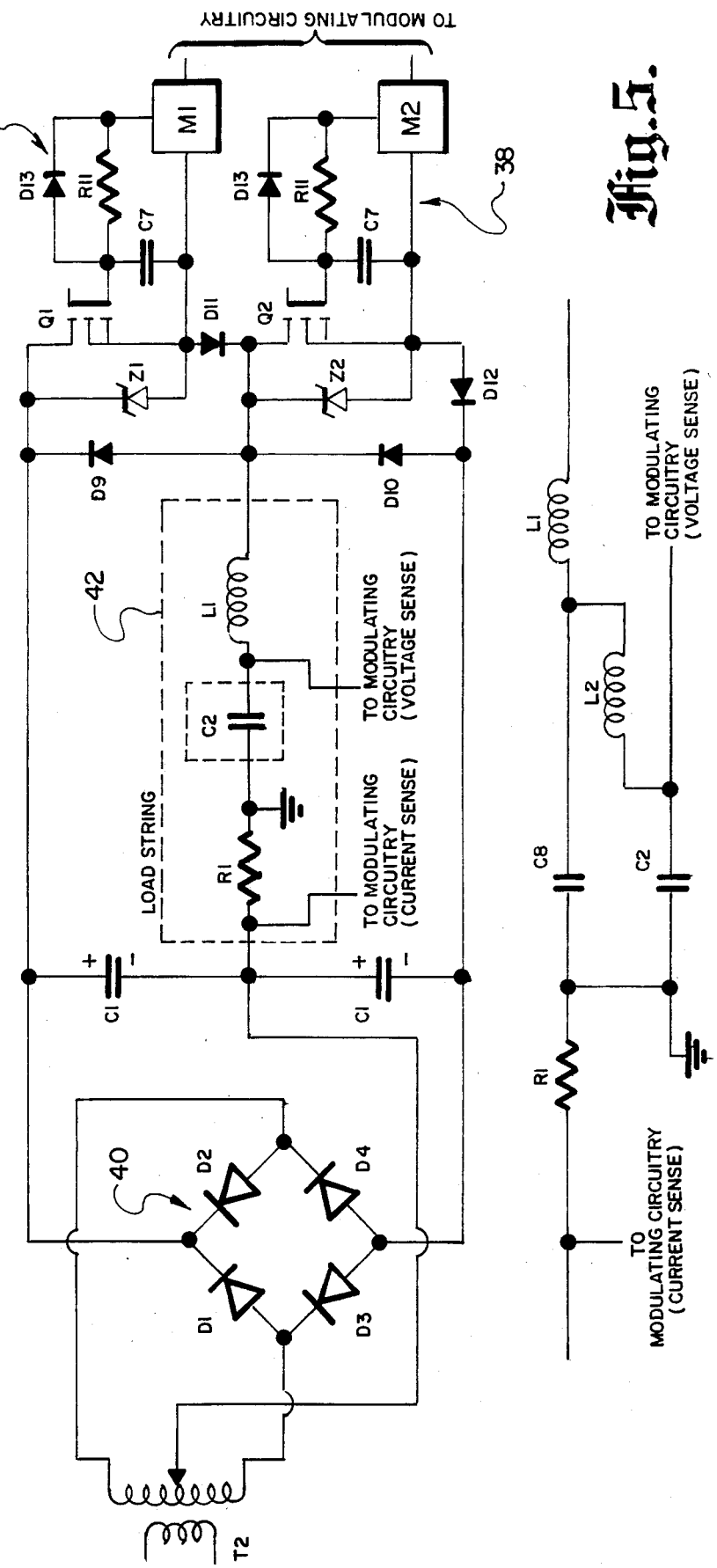

EFFICIENT POWER AMPLIFIER FOR HIGH CAPACITIVE DEVICES

STATEMENT OF GOVERNMENT INTEREST

The Government has rights to this invention pursuant to Contract No. F29601-81-C-0056 awarded by the U.S. Dept. of the Air Force.

BACKGROUND OF THE INVENTION

1. Field of the Invention

The present invention is directed to power amplifiers, and, more particularly, to power amplifiers for high capacitive devices which require high-voltage drive and wide bandwidth.

2. Description of the Prior Art

Piezoelectric actuators and other high-capacitive devices require high voltage drive. Driving them linearly in a conventional amplifier requires a large reactive current and results in correspondingly high losses.

Piezoelectric actuators have been implemented as actuators for various wide bandwidth optical positioning and wavefront correction devices. The actuators are formed from stacks of piezoceramic wafers and appear basically as pure capacitive loads to the driving amplifier. As a consequence, almost all of the driving power is dissipated in the output stage of the amplifier. This is an advantage in thermal management of the actuators but places a heavy burden on amplifier design. The quantity of driver-dissipated, or "reactive power", is a function of the square of the driver output voltage for a given operating frequency.

Electrostatic loudspeakers are another type of high-capacitive device that requires high voltage drive and wide bandwidth. These devices contain a deformable membrane serving as one plate of a capacitor. Voltage impressed across the capacitor plates causes deformation of the membrane which couples acoustic energy into the air.

Class A, B, C amplifiers and combinations thereof are typically used to drive high-capacitive loads. Electronic vacuum tubes are capable of handling high voltage and are used in either linear or tuned amplifier applications. A linear amplifier (Class A or B) design provides wide bandwidth, but the losses are very high due to the reactive component of the load circuit. A tuned amplifier (Class C) using a tank circuit with the load capacitor forming part of the tank, will be more efficient; however, the bandwidth is not wide and depends on the quality factor, Q, of the tank circuit.

OBJECTS OF THE INVENTION

A principal object of the invention is, therefore, to provide an amplifier which delivers high-voltage drive for a high-capacitive device without correspondingly high losses.

Another object of the present invention is to provide a highly linear, efficient and economical amplifier circuit.

Yet another object of the present invention is to provide an amplifier with flat response from dc to some high frequency.

Still another object is to provide an amplifier that operates as a high voltage power operational amplifier in that its input/output transfer function is determined by the type and arrangement of feedback components.

Other objects, advantages and novel features of the present invention will become apparent from the following detailed description of the invention when considered in conjunction with the accompanying drawings.

SUMMARY OF THE INVENTION

The present invention is a power amplifier circuit especially suitable for high capacitive devices. A load string which includes an inductor connected with the device to be driven is connected to capacitive means so that during operation of the circuit the inductor exchanges energy between the device and the capacitive means. The capacitive means is kept charged by a dc power source. The circuit includes means, connected to the load string, for sensing current through the load string and for producing a triangular waveform of current in the load string for causing charge to be alternatively removed from the capacitive means and delivered to the device through the inductive means. Charge is then returned to the capacitive means with any losses replenished by the dc power source. Voltage sensing means are also connected to the load string for sensing voltage across the device and to modulate the triangular current waveform.

The amplifier behaves as a stable linear dc coupled operational amplifier, delivering a large reactive current with only slight losses. It combines the best features of both a linear amplifier (Class A or B) and a tuned amplifier (Class C) in that a resonant circuit consisting of an inductance and the load capacitance is used to provide the large reactive current, but the current is controlled to provide wide bandwidth response down to dc.

BRIEF DESCRIPTION OF THE DRAWINGS

FIG. 3 is an illustration of the pulse-width modulated waveform.

FIG. 4 is a circuit diagram showing an alternative embodiment of a power bridge for the present invention.

FIG. 5 is a circuit diagram of an alternative embodiment of a portion of the power bridge of FIG. 4 which includes additional filtering of the output signal.

DETAILED DESCRIPTION OF THE PREFERRED EMBODIMENT

Figure 1:
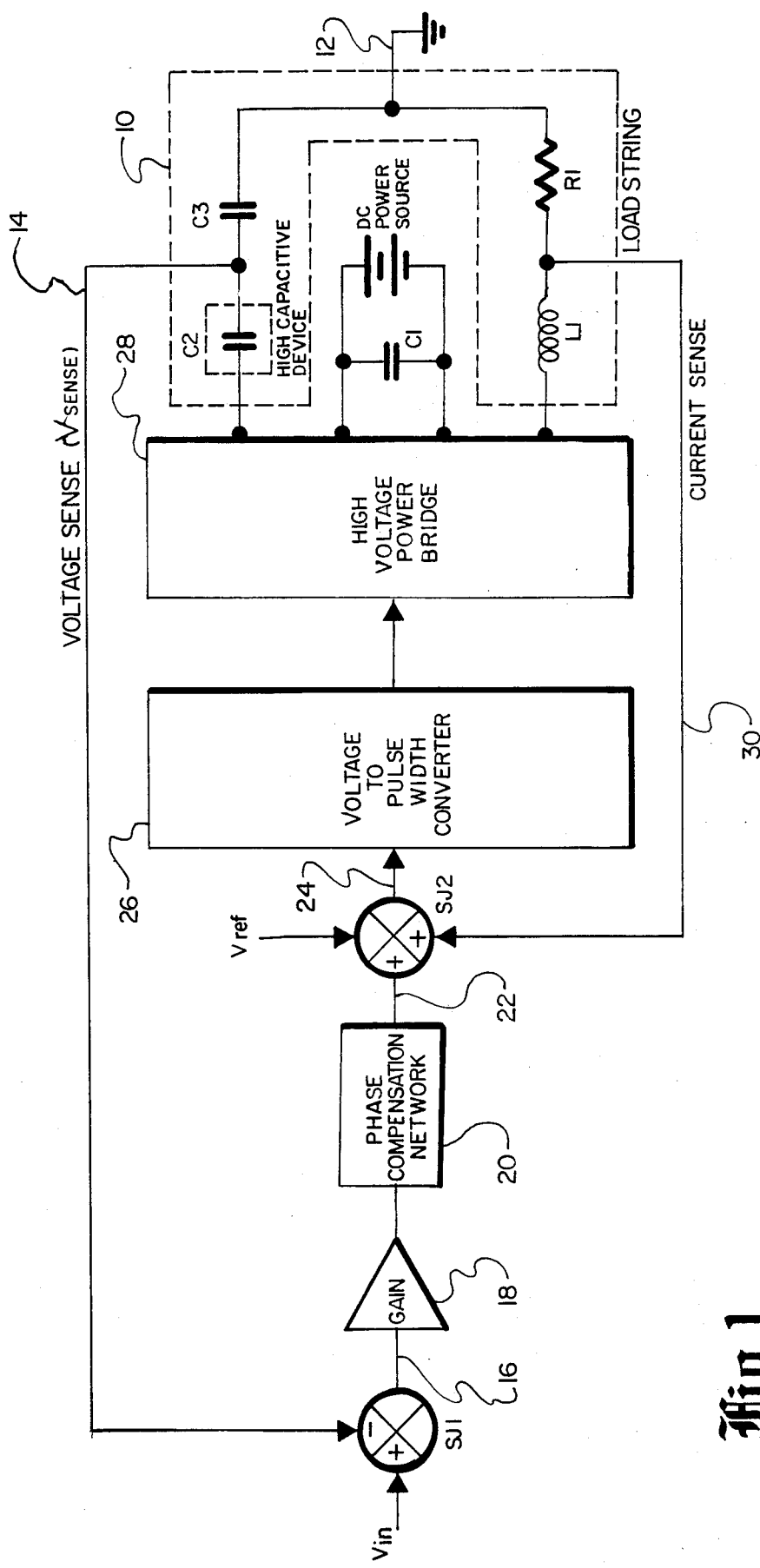
FIG. 1 is a block functional diagram representing the presently preferred inventive embodiment.

Referring to FIG. 1, the high-capacitive device required to be driven by the amplifier of the present invention is designated C2 in load string 10. The device typically has a capacitance greater than 1000 pico farads. Load string 10 consists of high-capacitive device C2 in series with a reference capacitor C3, a resistor R1, and an inductor L1. The amplifier is designed so that the inductor L1 can be made to exchange energy between the capacitance of the high-capacitive device C2 and a large capacitor C1 connected to the dc power source. Voltage across C3 to ground 12 follows the input voltage, $V_{in}$, with little error by means of voltage-sensing feedback 14. The input signal, $V_{in}$, to the amplifier is typically an analog waveform between ±10 volts.

Figure 2:
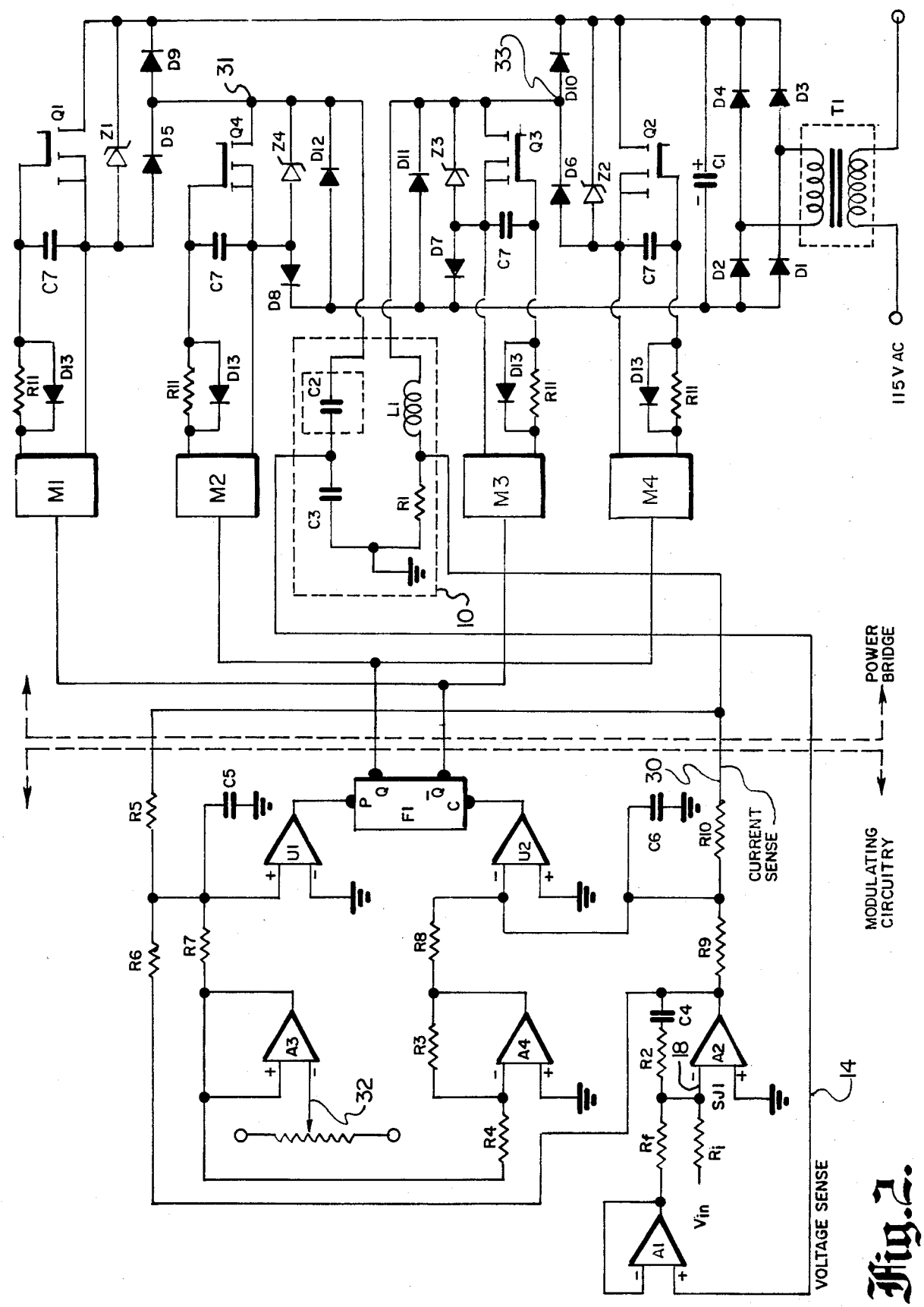
FIG. 2 is a circuit diagram showing a presently preferred implementation of the FIG. 1 apparatus.

An error voltage 16 is derived by summing junction SJ1 which is equal to the difference between $V_{in}$ and $V_{sense}$. This error voltage 16 is amplified by gain stage 18. Referring to FIG. 2, which is a circuit diagram showing the presently preferred implementation of the FIG. 1 apparatus, a follower amplifier A1 is shown connected to voltage-sensing feedback 14 so that the voltage appearing across C3 also appears across the output of A1. The gain stage 18 includes a summing amplifier A2 which is connected to the output of A1 so that a voltage output of A2 is generated which is proportional to the difference between $V_{in}$ and $V_{sense}$. A resistor $R_f$ between the output of A1 and input of A2 together with an input resistor $R_i$ determine the closed loop gain of the present amplifier by the formula:

$$V_{sense}/V_{in} = -R_f/R_i$$

Therefore, the amplifier of the present invention operates as a high voltage power operational amplifier in that its input/output transfer function is determined by the magnitude of resistors $R_i$ and $R_f$.

The charge on high-capacitive device C2 is controlled regardless of capacitive changes which might occur as a function of voltage or temperature as a result of C2 and C3 being in series. Since the charge on C2 equals the charge on C3 which is equal to $Q=CV$, controlling voltage on C3 also controls the charge on C2. The reference capacitor C3 is much larger than device C2 (see Table 1 below) and, therefore, most of the voltage will fall across C2, as desired, by the law of voltage division between capacitors in series, i.e.

$$V_{C2} = \frac{C3}{C2+C3} V_{C2+C3}.$$

A phase compensation network 20, referred to in FIG. 1, introduces suitable phase lead or lag to insure closed loop stability. The phase compensation network is comprised of resistor R2 and capacitor C4 connected to amplifier A2.

The amplified and phase corrected error voltage 22 is applied to another summing junction SJ2 where dc reference voltages, $V_{ref}$, developed by amplifiers A3, A4; a current sensing voltage, $V_{current\ sense}$; and, the phase corrected error voltage 22 are summed to produce another error voltage 24 which is applied to the input of a voltage to pulse-width converter 26. The voltage to pulse-width converter 26 consists of a pair of zero-crossing comparators U1, U2 connected to flip-flop F1.

The output of converter 26 is at high/low pulse levels to turn FET switches in a high voltage power bridge 28 ON and OFF. This results in an alternating triangle-like waveform of current in load string 10. This triangular current causes charge to be alternately removed from and replaced on capacitor C1 while the dc power source replenishes C1 to compensate for losses. The triangular waveform results in the load string having approximately a 100 mA peak amplitude current and 200 kHz rate. This alternating current serves to exchange energy between the inductances and capacitances in the circuit at a high rate (approximately 200 kHz) and in a lossless fashion.

Current in the load string is sensed and a voltage proportional to it provided ($V_{current\ sense}$), by monitoring the voltage across resistor R1 via feedback connection 30. This current sense voltage, $V_{current\ sense}$, as previously noted, is summed with dc reference voltages developed by amplifiers A3, A4 and the phase corrected error voltage. Amplifier A3 is a follower amplifier and it provides a low impedance dc voltage for the positive reference. A potentiometer 32 is used as a voltage divider and the voltage input into A3. Inverting amplifier A4, R3, R4 takes the A3 output and inverts it to provide a low impedance negative reference voltage of equal magnitude. Summing resistors R5 through R10 are provided for each input into comparators U1, U2. The inputs to comparators U1 and U2 are connected to ground through capacitors C5 and C6, respectively. When the voltage across R1 is compared to the equal but opposite polarity dc reference voltages developed by amplifiers A3 and A4, using this summing method, and the current in R1 exceeds a certain level, the appropriate comparator (U1 or U2) presets or clears flip-flop F1 to turn one MOSFET pair (i.e., Q1 and Q3) in the power bridge 28 OFF and the other pair of MOSFETs (i.e., Q2 and Q4) ON, to reverse the current flow through the load string. Specifically, when MOSFET pair Q1, Q3 is ON and MOSFET pair Q2, Q4 is OFF current will flow through Q1, through C2 and the rest of the load string, through Q3 and back to the negative side of C1. On the other half-cycle, when MOSFET pair Q2, Q4 is ON, current will flow from the positive side of C1, through Q2, through L1 and the rest of the load string, through Q4 and back to the negative side of C1. Hence, the voltage polarity on the load string is alternatively reversed.

The power bridge 28 is powered by transformer T1 which converts the line power to high voltage. The power is rectified by diodes D1, D2, D3, and D4 so that high voltage dc is stored on capacitor C1 and impressed on the MOSFET bridge.

Associated with each MOSFET are diodes D5 through D12 and zener diodes Z1 through Z4. The zener diodes serve to limit any voltage spikes to levels below the MOSFET breakdown voltage to prevent device failure. Diodes D5 through D12 steer reverse current that would otherwise flow through each MOSFET bulk diode. Currents flowing in the reverse direction tend to slow down the MOSFET switching times. During the time when reverse current is flowing the inductor L1 is acting as a source and delivering its stored energy back to C1. The amplifier derives high efficiency from this effect. Also associated with each MOSFET is a resistor R11, capacitor C7, diode D13 combination. These components are arranged so that the MOSFET turns ON slow and OFF fast. If this were not down there are occasions where Q1 and Q4 or Q2 and Q3 would be on together for short periods but long enough to place a direct short across C1 and destroy the MOSFETs. The gate to source voltage which turns on the MOSFET is delayed by the RC time constant of R11 and C7 plus the intrinsic input capacitance of the MOSFET. However, on turnoff the capacitance is discharged through the diode D13 so no delay occurs. Modules M1, M2, M3 and M4 represent optically and electrically isolated drive circuits which serve to isolate the MOSFET drive signals from the rest of the circuit. Optoisolators transmit the drive signals without allowing any dc path between the modulating circuitry and the field-effect transistors. The whole bridge floats with respect to the rest of the circuit except for the ground connection 12 between C3 and R1.

At the bridge output 31,33 a rectangular waveform of voltage will appear. The filtering effect of L1, C2, and C3 allows a faithful reproduction of the input voltage ($V_{in}$) to appear across C3 with only a small ripple at the basic modulation rate. The small capacitors C5, C6 on U1 and U2 filter spurious noise. A pulse-width modulation results because the error signal 24 changes the switching points of U1 and U2 so that the triangular current waveform in the load string changes its duty cycle. FIG. 3 illustrates a pulse-width modulated waveform 34. By filtering this waveform the corresponding analog signal and dc offset can be recovered. Curve 36 superimposed upon waveform 34 in FIG. 3 illustrates the waveform after being passed through the low pass filter. The modulation frequency changes somewhat with duty cycle. For example, if the dc voltage across C3 is zero, the current waveform will be a triangle of 50% duty cycle. If the input dc voltage is changed to other than zero the current waveform will be changed in duty cycle during the transition so that it will leave the correct quantity of charge accumulated on C3. After the transition it will return to a 50% duty cycle. This charge results in a dc voltage across C3 corresponding to the input voltages.

The resonance frequency of L1 and the series combination of C2 and C3 is set between the upper band width of the amplifier and the modulation frequency. The upper cutoff frequency is approximately one-tenth of the modulation frequency, therefore, approximately 10-20 kHz. Current sensing causes the amplifier open loop response to roll off at 6 DB/octave, making the amplifier unconditionally stable.

Table 1 provides illustrative component values for the components shown in FIG. 2.

TABLE 1

| A1-A4 | LF356 | $R_f$ | 5 KΩ |
|---|---|---|---|
| C1 | 2000 μF | $R_i$ | 5 KΩ |
| C2 | 10 μF | R1 | .5 Ω |
| C3 | 100 μF | R2 | 20 KΩ |
| C4 | .1 μF | R3 | 10 KΩ |
| C5,C6 | .0047 μF | R4 | 10 KΩ |
| C7 | .0033 μF | R5-R10 | 1 KΩ |
| D1-D4 | MDA 2506 | R11 | 2 KΩ |
| D5-D12 | MR856 | T1 | 115 VAC/60 Hz, 400 VAC |
| F1 | 74C74 | U1,U2 | LM 339 |
| L1 | 2.25 mH | Z1-Z4 | 1N2846 (several series connected) |
| Q1-Q4 | BUZ 45 | | |

μF = Microfarads
KΩ = Kilohms
mH = Millihenrys

It is noted that there are very large circulating electric currents since the current serves to facilitate interchange of energy, but the system is very efficient. For example, at 1 KHz the capacitive reactance of a 10 μf high capacitive device is about 16 ohms. To drive 16 ohms with a 500 volt peak sine wave will require 31.25 amperes peak current. This current is 90 degrees out of phase with the voltage so it is reactive and does not deliver power. Additional in-phase current must be supplied for the high capacitive device to move its load. If a linear amplifier were driving the device it would have to dissipate 15.6 KW just to supply the reactive current. The present invention requires less than 30 watts.

This invention is especially suitable for high bandwidth optical positioning and wavefront correction devices; specifically, phased arrays, fast steering mirrors for lasers, adaptive optics phase correcting devices and other applications requiring efficient wide bandwidth piezodrives. It is also useful for sonar devices for transmitting high frequency sonic waves and for electrostatic speakers used in high fidelity reproduction. This invention is useful for high voltage devices, in general, because it is more reliable and simpler than vacuum tube linear amplifiers.

Various other types of power bridges may be used other than the power bridge described in relation to FIG. 2. The circuit diagram of FIG. 4 shows an alternative embodiment of a power bridge which only requires two MOSFET switches 36, 38. The reference capacitor C3 has been eliminated from this embodiment to illustrate an application where voltage rather than charge is controlled. A center tapped transformer T2 is utilized together with a bridge rectifier 40 to produce a bipolar dc output. Two primary energy storage and exchanging capacitors C1 are used which receive positive and negative polarities with respect to signal ground. In this case the voltage cross the high capacitive device C2 is proportional to the input voltage, $V_{in}$, the proportion being determined by the formula as previously explained.

In FIG. 5, the dashed portion 42 of FIG. 4 has been modified to include another inductor L2 and a prefiltering capacitor C8. The high capacitive device C2 and added inductor L2 are in parallel with the prefiltering capacitor C8. Most of the triangular waveform current flows through the prefilter capacitor C8. Additional filtering takes place in the added inductance. The additional filtering reduces the modulation frequency content of the output signal. This is desirable for precision applications where unwanted noise may adversely effect performance. These desired effects may also be achieved by adding a resistor in place of inductor L2.

MOSFETs can be added in parallel to increase the current handling capability or in series to increase the voltage handling capability. For series applications each MOSFET requires an isolation and level shifting circuit to develop its gate drive signal.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A power amplifier circuit for driving a high-capacitive device, comprising:
a load string including inductive means connected to said device;
capacitive means connected to said load string, wherein during operation of said circuit said inductive means exchanges energy between said device and said capacitive means;
a dc power source for charging said capacitive means;
means for producing a full wave alternating triangular waveform of current in said load string including,
current sensing means connected to said load string, and
comparing means connected to said current sensing means for comparing current circulating in said load string to equal and opposite polarity reference levels so that equal charge is alternately removed from said capacitive means and delivered to said device through said inductive means then returned to said capacitive means with any losses replenished by said dc power source;
means connected to said load string for sensing charge contained in said high capacitive device and to modulate said full wave alternating triangular current waveform;

whereby, said amplifier behaves as a stable linear dc coupled single pole operational amplifier delivering a large reactive current with only slight losses.

2. The amplifier circuit, according to claim 1, wherein said charge sensing and modulated waveform production means includes:
   a reference capacitor connected in series with said load string;
   means for summing the voltage across said reference capacitor with an external input voltage said summation resulting in a first error signal;
   a first amplifying means for amplifying said first error signal; and
   means associated with said amplifying means to introduce phase lead or lag for insuring closed loop stability.

3. The amplifier circuit, according to claim 2, wherein said triangular waveform producing means includes:
   a resistor in series with said load string;
   second amplifying means for developing dc reference voltages;
   means for summing the voltage across said resistor with said first error signal and said dc reference voltages said summation resulting in a second error signal;
   first and second comparators for comparing said second error signal;
   a plurality of field-efficient transistors connected to said circuit whereby when some of said transistors are ON current flows in one direction through said device and when others are ON the current flows in the reverse direction; and
   flip-flop means connected to said comparators and to said transistors for turning the appropriate transistors ON and OFF, and holding the ON/OFF state;
   whereby, when the current in said resistor exceeds a comparison level said first comparator presets or clears said flip-flop means to reverse the current flow and when the current in said resistor again exceeds the comparison level said second comparator switches and changes the flip-flop state to again reverse the current flow, thereby resulting in a triangular waveform through said load string.

4. The amplifier circuit, according to claim 3, further including:
   a plurality of optically and electrically isolated drive circuits each drive circuit connected to each of said field-effect transistors, said drive circuits for isolating the field-effect transistor drive signls from the rest of said amplifier circuit.

5. The amplifier circuit, according to claim 3, wherein said plurality of field-effect transistors includes a first pair of MOSFETS which when ON allow current to flow in one direction through said load string on one half-cycle and a second pair of MOSFETs which when ON allow current to flow in a reverse direction through said load string.

6. The amplifier circuit, according to claim 5, further including:
   a resistor, capacitor, diode combination connected to each of said MOSFETs, so that each MOSFET turns ON slow and OFF fast to prevent an occasion where a MOSFET pair is on for a short period but long enough to place a direct short across said capacitive means.

7. The amplifier circuit, according to claim 6, further including diodes connected to said MOSFETs to steer reverse current that would otherwise flow through each MOSFET bulk diode.

8. The amplifier circuit, according to claim 7, further including zener diodes connected to said MOSFETs to limit any voltage spikes to levels below the MOSFET breakdown voltage to prevent device failure.

9. The amplifier circuit, according to claim 3, further including small capacitors connected to said comparators to filter spurious noise.

10. The amplifier circuit, according to claim 1, wherein said capacitive means includes two capacitors connected in series.

11. The amplifier circuit, according to claim 10, further including:
    a second capacitive means connected to said load string; and
    a second inductive means connected to said second capacitive means for blocking high frequency noise, whereby, the modulation frequency content of the output signal of said amplifier is reduced.

12. The amplifier circuit, according to claim 1, wherein said dc power source includes:
    a bridge rectifier; and
    a center tapped transformer connected to said bridge rectifier for producing a bipolar dc output.

13. A power amplifier circuit for driving a high-capacitive device requiring high voltage drive, comprising:
    a load string containing a plurality of elements in series, said elements including:
    said high-capacitive device,
    a reference capacitor grounded at a first end,
    a resistor grounded at a first end, and
    an inductor,
    capacitive means connected to said load string for storing energy during operation, said inductive means exchanging energy between said device and said capacitive means;
    a feedback connection from a second end of said reference capacitor to a follower amplifier and then to a summing amplifier, said summing amplifier connected to a voltage input of said power amplifier so that the voltage at the output of said summing amplifier is proportional to the difference between said input voltage and the voltage across said reference capacitor;
    first and second voltage generating amplifiers connected to said follower amplifier and said summing amplifier and also connected to a feedback connection from a second end of said resistor, said first voltage generating amplifier for providing a low impedance dc voltage as a positive reference, said second voltage generating amplifier for providing a lower impedance negative reference voltage of equal magnitude;
    a first comparator for comparing the summation of said negative reference voltage, the outputs from said follower amplifier and said summing amplifier, and the voltage across said resistor with ground;
    a second comparator for comparing the summation of said positive reference voltage, the outputs from said follower amplifier and said summing amplifier, and the voltage across said resistor with ground;
    flip-flop means connected to said first and second comparators, said flip-flop means for determining the path for current flow through a power bridge, said power bridge for directing the magnitude and direction of current flow through said load string;

whereby, during operation of said power amplifier a modulated, full wave alternating, triangular waveform of current is produced in said load string for causing charge to be alternately removed from said capacitive means and delivered to said device through said inductive means then returned to said capacitive means, said power amplifier behaving as a stable linear dc coupled operational amplifier delivering a large reactive current with only slight losses.

14. The power amplifier, according to claim 13, wherein said power bridge includes:

a transformer for converting line power to high voltage power;

a plurality of diodes for rectifying said high voltage power so that high voltage dc is stored on said capacitive means;

a plurality of field-effect transistors so arranged and connected to said circuit whereby when some of said transistors are ON current flows in one direction through said device and when others are ON the current flows in the reverse direction; and a plurality of optically and electrically isolated drive circuits each drive circuit connected to each of said field-effect transistor and to said flip-flop means, said drive circuits for isolating the field-effect transistor drive signals from the rest of said amplifier circuit.

* * * * *